(12) United States Patent
Chen (10) Patent No.: US 7,391,651 B2
(45) Date of Patent: Jun. 24, 2008

(54) METHOD FOR PROGRAMMING NAND FLASH MEMORY DEVICE AND PAGE BUFFER PERFORMING THE SAME

(75) Inventor: Chung Zen Chen, Hsinchu (TW)

(73) Assignee: Elite Semiconductor Memory Technology Inc., Taiwan (CN)

( * ) Notice: Subject to any disclaimer, the term of this patent is extended or adjusted under 35 U.S.C. 154(b) by 140 days.

(21) Appl. No.: 11/432,416

(22) Filed: May 12, 2006

(65) Prior Publication Data

US 2007/0263446 A1    Nov. 15, 2007

(51) Int. Cl.
G11C 11/34    (2006.01)
G11C 16/04    (2006.01)

(52) U.S. Cl. .............................. 365/185.24; 365/185.17

(58) Field of Classification Search ............ 365/185.24, 365/185.03, 185.17
See application file for complete search history.

(56) References Cited

U.S. PATENT DOCUMENTS

| 5,768,188 | A | 6/1998 | Park et al. |
| 5,986,929 | A | 11/1999 | Sugiura et al. |
| 6,411,551 | B1 | 6/2002 | Kim et al. |
| 2008/0008008 | A1* | 1/2008 | Chen et al. ............. 365/185.28 |

* cited by examiner

Primary Examiner—Huan Hoang
Assistant Examiner—Michael J Weinberg
(74) Attorney, Agent, or Firm—Oliff & Berridge, PLC (57) ABSTRACT

A method for programming a multi-level-cell NAND flash memory device having plural memory cells is disclosed to reduce the programming time. The method comprises: programming each memory cell to a zero state, programming from the zero state to a first state by activating a first program signal and programming from the zero state to a quasi-second state and a semi-third state by activating a second program signal, programming from the quasi-second state to a second state and programming from the semi-third state to a quasi-third state by activating the second program signal, and programming from the quasi-third state to a third state by activating the first program signal. The present invention also discloses a page buffer to perform the method for programming a multi-level-cell NAND flash memory device, which comprises a bit line selection circuit, a first register, a second register, a first verify circuit, a second verify circuit and an exclusion circuit.

9 Claims, 8 Drawing Sheets

METHOD FOR PROGRAMMING NAND FLASH MEMORY DEVICE AND PAGE BUFFER PERFORMING THE SAME

BACKGROUND OF THE INVENTION

1. Field of the Invention

The present invention relates to a method for programming a NAND flash memory device and a page buffer performing the same, and more particularly, to a method for programming a multi-level-cell NAND flash memory device, which stores 2-bit information per memory cell and a page buffer performing the same.

2. Description of the Related Art

In a traditional NAND flash memory device, memory cells can take one of two information storing states, namely, the "ON" state and the "OFF" state. One bit of information is defined by the ON or OFF state of a respective memory cell. In order to store data of N bits (N: a positive integer of 2 or greater) in the aforesaid traditional NAND flash memory device, N independent memory cells are necessary. When it is required to increase the number of bits of data to be stored in a NAND flash memory device having one-bit memory cells, the number of such memory cells should increase accordingly. Information stored in the one-bit memory cell is determined by the programmed status of the memory cell where programming is used to store the desired information in the memory cell. The information storing state of the memory cell is determined by the threshold voltage which is a minimum voltage to be applied between the gate and source terminals of the transistor included in the memory cell to switch the cell transistor to its ON state.

Figure 1:
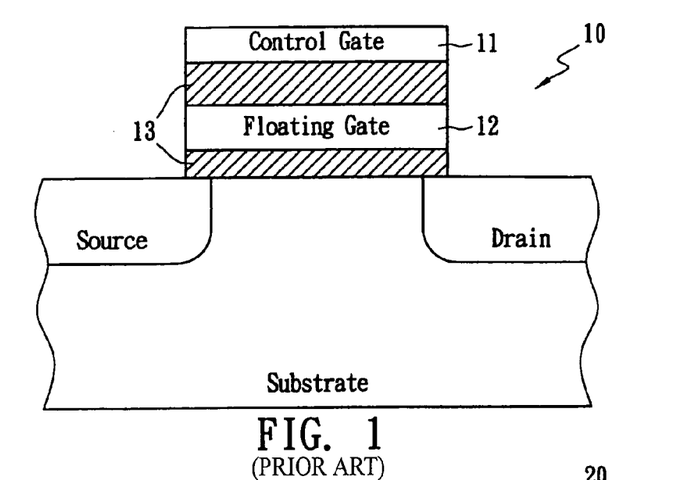
FIG. 1 shows a memory cell transistor capable of storing 2-bit information.

FIG. 1 shows a memory cell transistor 10 capable of storing 2-bit information, which is used in the NAND flash memory device. The memory cell transistor 10 has two gates including upper and lower layers laminated on a channel region between source and drain regions. The upper gate is called a control gate 11 and the lower gate is called a floating gate 12. The floating gate 12 is a charge storage portion surrounded by an insulating material 13 between the control gate 11 and the channel region. Accordingly, the state of information stored in each memory cell can be distinguished by the threshold voltage of that memory cell.

Figure 2:
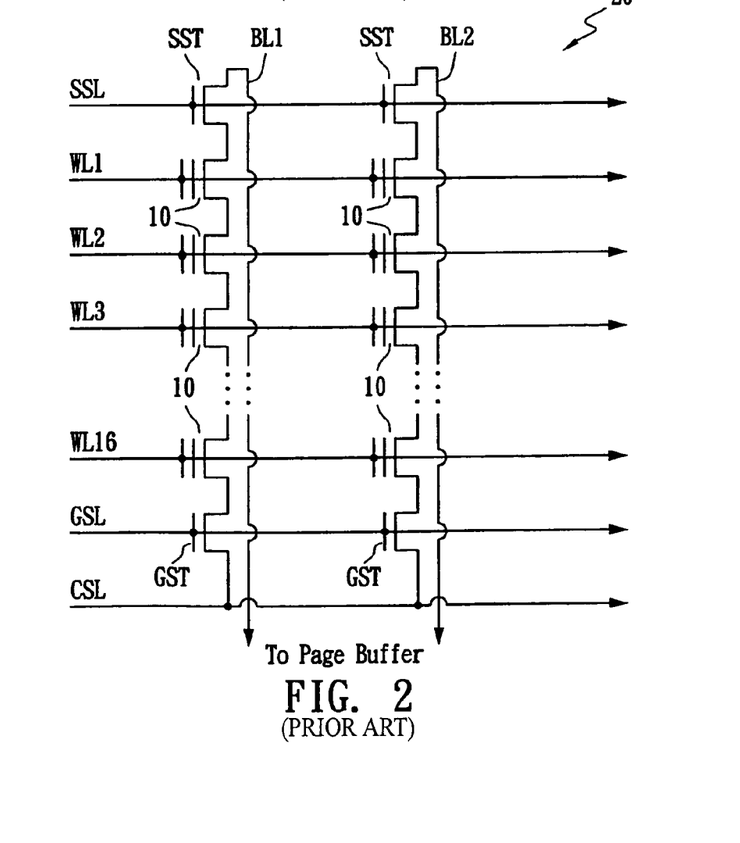
FIG. 2 shows two strings in a memory cell array of a NAND flash memory device.

FIG. 2 shows two strings in a memory cell array 20 of a NAND flash memory device, where each memory cell 10 stores two-bit information. The memory cell array 20 comprises plural memory cells 10 connected in series between a bit line (BL1 or BL2) and a ground select line GSL. A group of memory cells 10 connected in series to one bit line (BL1 or BL2) along with select transistors (a string select transistor SST and a ground select transistor GST) used to select the memory cells 10 is called a string. The string select transistor SST is selectively switched on to couple the associated string and the bit line together. The ground select transistor GST is selectively switched the connection between each string and a common source line CSL.

Figure 3:
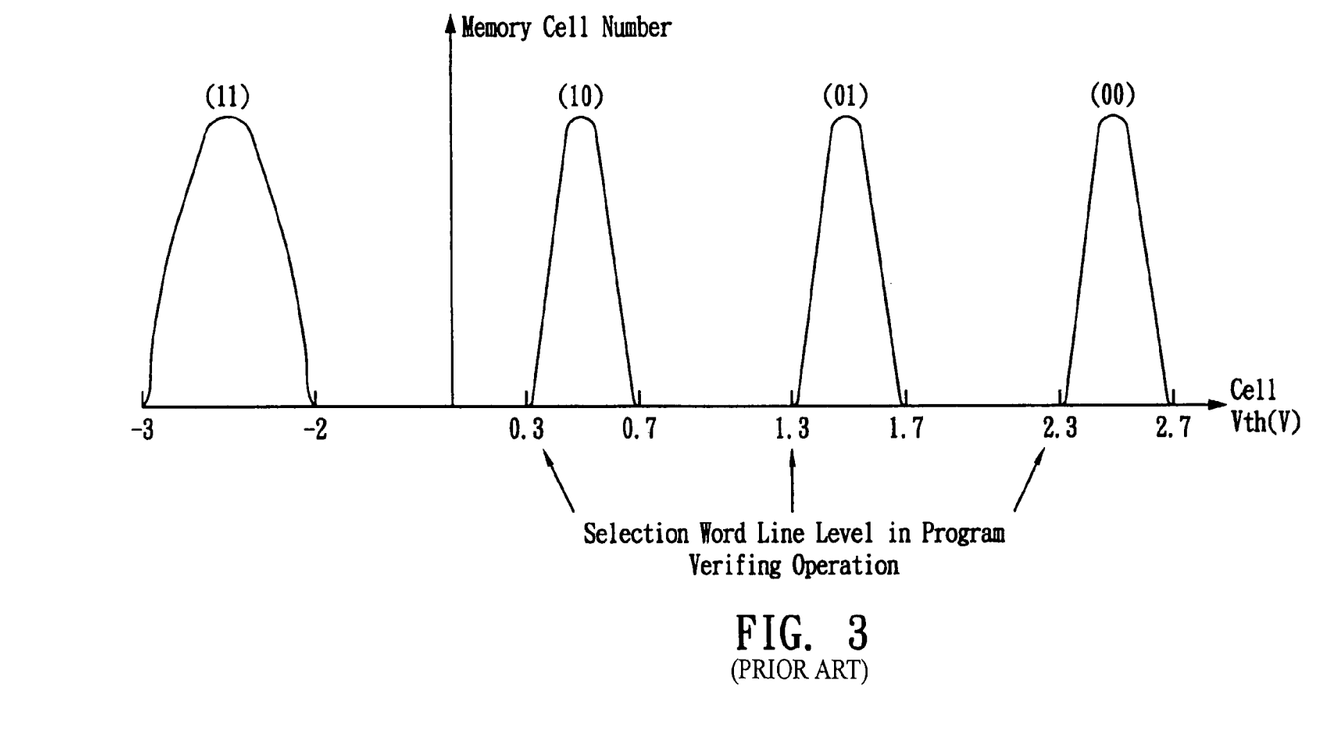
FIG. 3 shows a threshold voltage distribution of a memory cell according to programmed data.

FIG. 3 shows a threshold voltage distribution of a memory cell according to programmed data. As shown in FIG. 3, the programmed data exhibits one of a threshold voltage (indicating 2-bit data of (11)) lower than −2.0V, a threshold voltage (indicating 2-bit data of (10)) between 0.3V to 0.7V, a threshold voltage (indicating 2-bit data of (01)) between 1.3V to 1.7V, and a threshold voltage (indicating 2-bit data of (00)) between 2.3V to 2.7V. Data can be stored in four different stages in one memory cell on the basis of such threshold voltage distributions.

Figure 4A:
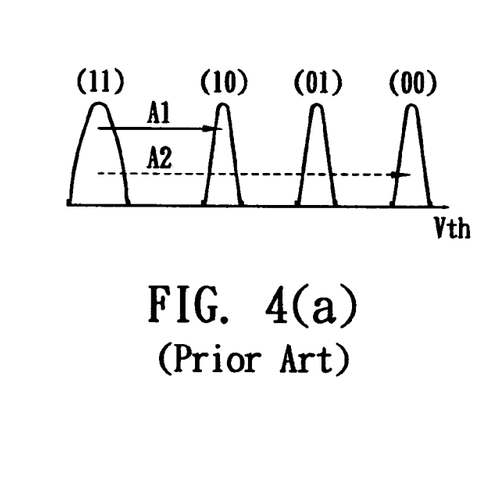
FIGS. 4(a)-4(c) illustrate the state transitions of the memory cells for each phase of the program operation of a first prior art.
Figure 4B:
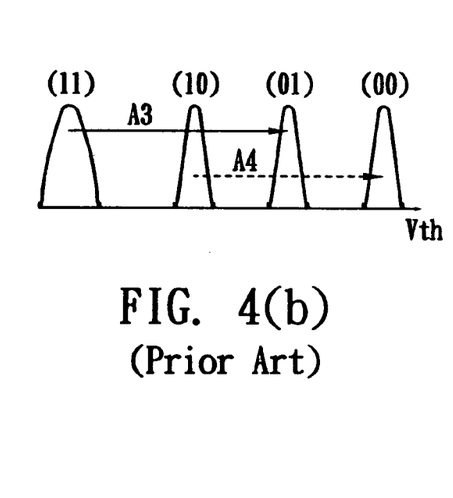
Figure 4C:
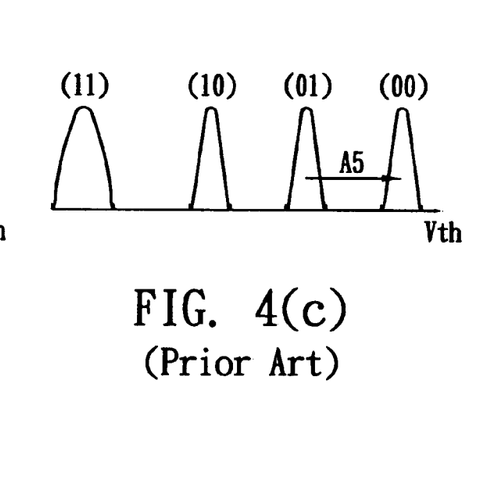

As for the program operation applied in a multi-level-cell NAND flash memory device, some traditional program methods are given as follows. U.S. Pat. No. 5,768,188, herein incorporated by reference and hereinafter '188, discloses a three-phase program operation with a timing chart (refer to FIG. 5 of '188). Before program operation, all memory cells are reset to the state of (11) and the 2-bit information to be programmed is loaded into registers Q2 and Q1 (refer to FIG. 1 of '188), and the registers Q2 and Q1 latch the MSB and the LSB of the 2-bit information, respectively. FIGS. 4($a$) through 4($c$) show the state transition of the memory cells for each phase of the program operation, and are used to program the memory cells to be programmed to the states of (10), (01) and (00), respectively. In FIG. 4($a$), Phase One, the memory cells to be programmed to the state of (10) are programmed from the state of (11), which is indicated by a solid pointer A1; and the memory cells to be programmed to the state of (00) are programmed from the state of (11), which is indicated by a dashed pointer A2; but the memory cells to be programmed to the state of (01) are not programmed. The solid pointer A1, starting from (11) and ending in (10), means the program operation for the memory cells to be programmed to the state of (10) is completed; however, the dashed pointer A2, starting from (11) and ending in (00), means the memory cells to be programmed to the state of (00) are still under programming. In FIG. 4($b$), Phase Two, the memory cells to be programmed to the state of (01) are programmed directly from the state of (11), which is indicated by a solid pointer A3 that means the program operation thereof is completed; in the meantime, the memory cells to be programmed to the state of (00) are programmed from the state of (10), which is indicated by a dashed pointer A4 that means the memory cells to be programmed to the state of (00) are still under programming. The states of (01) and (00) latched in the registers Q2 and Q1 change to (11) and (10), respectively, according to the logic of FIG. 1 of '188 (i.e., the verify operation following the program in Phase Two, referring to FIG. 5 of '188). That is, the Q2 state changes from logic low to logic high. Thus, the program operation is inhibited for the memory cells that have already been programmed to the state of (01) or (00), due to the high state of the register Q2 that latches the MSB of the 2-bit information to be programmed. Also, there is no over program concern for the state of (00) when the state of (00) is programmed concurrently with the state of (01). In FIG. 4($c$), Phase Three, the memory cells to be programmed to the state of (00) are programmed from the state of (01) to the state of (00), which is indicated by a solid pointer A5 that means the program operation for the memory cells to be programmed to the state of (00) is completed.

Figure 5A:
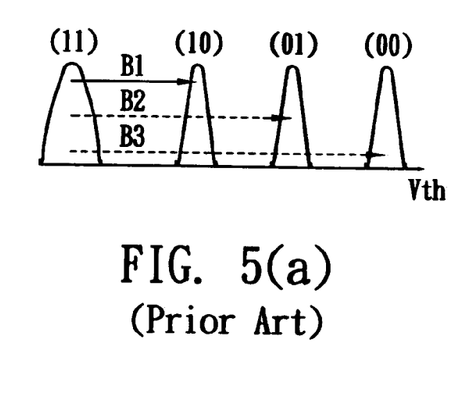
FIGS. 5(a)-5(c) illustrate the state transitions of the memory cells for each phase of the program operation of a second prior art.
Figure 5B:
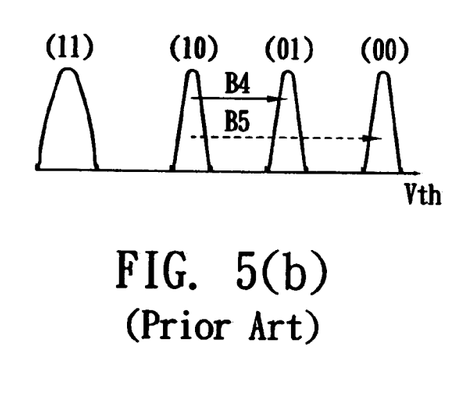
Figure 5C:
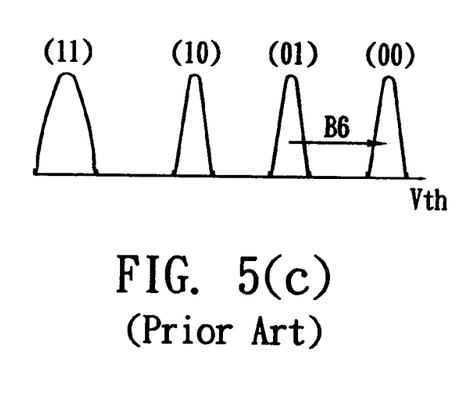

FIGS. 5($a$) through 5($c$) show the state transition of the memory cells for each phase of the program operation disclosed in U.S. Pat. No. 6,411,551, herein incorporated by reference and hereinafter '551. Note that FIGS. 5($a$) through 5($c$) are used to program the memory cells to be programmed to the states of (10), (01) and (00), respectively. The program operation disclosed in '551 attempts to address an issue with '188. The issue is that memory cells to be programmed to the state of (01) are programmed directly from the state of (11); consequently, a wider threshold voltage distribution is formed, which causes narrower margins with adjacent threshold voltage distributions. In FIG. 5($a$), Phase One, the memory cells to be programmed to the state of (01) and (00) (indicated by dashed pointers B2 and B3, respectively) are also programmed from the state of (11), while the state of (10) is programmed (indicated by a solid pointer B1). Note that the dashed pointers B2 and B3 mean the associated program operations are not completed. In FIG. 5($b$), Phase Two, the memory cells to be programmed to the state of (00) are still under programming (indicated by a dashed pointer B5); at the same time, the memory cells to be programmed to the state of (01) from the state of (10) are programmed and completed (indicated by a solid pointer B4). Finally, referring to FIG. 5(c), the memory cells to be programmed to the state of (00) are programmed and completed (indicated by a solid pointer B6).

Figure 6A:
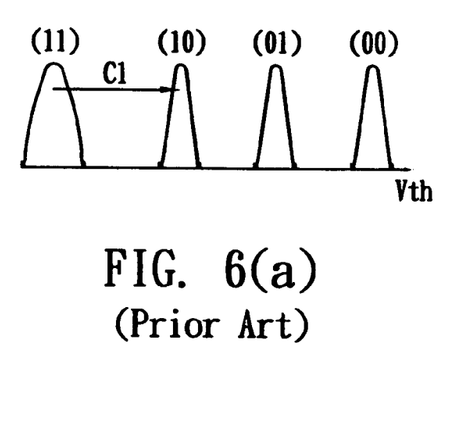
FIGS. 6(a)-6(c) illustrate the state transitions of the memory cells for each phase of the program operation of a third prior art.
Figure 6B:
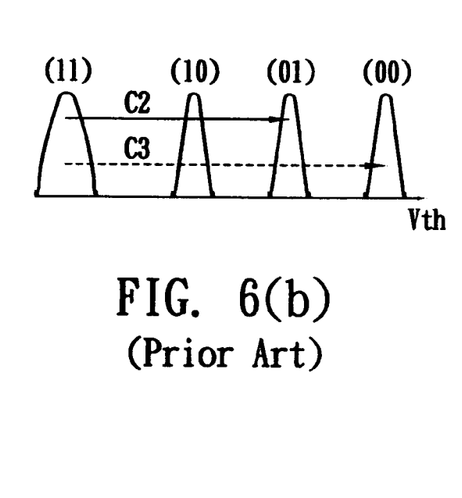
Figure 6C:
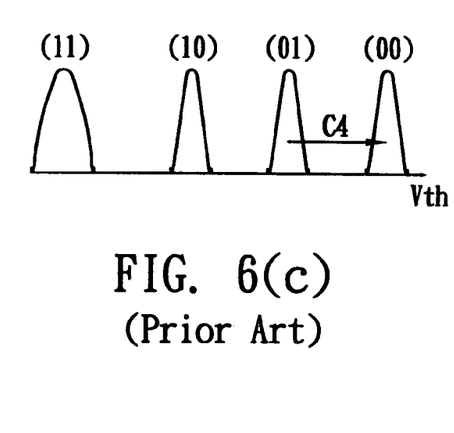

FIGS. 6(a) through 6(c) show the state transition of the memory cells for each phase of the program operation disclosed in U.S. Pat. No. 5,986,929, herein incorporated by reference and hereinafter '929, and are used to program the memory cells to be programmed to the states of (10), (01) and (00), respectively. In FIG. 6(a), Phase One, the program operation for the memory cells to be programmed to the state of (00) is inhibited, which can reduce the over program of the state (00) (refer to FIG. 4(a)) of '188. That is, only the program operation for the memory cells to be programmed to the state of (10) (indicated by a solid pointer C1) is performed and completed. In FIG. 6(b), Phase Two, a solid pointer C2 means the program operation for the memory cells to be programmed to the state of (01) from the state of (11) is completed; however, a dashed pointer C3 means the memory cells to be programmed to the state of (00) are still under programming. In FIG. 6(c), Phase Three, a solid pointer C4 means the program operation for the memory cells to be programmed to the state of (00) from the state of (01) is completed.

SUMMARY OF THE INVENTION

The primary objective of the present invention is to provide a method for programming a multi-level-cell NAND flash memory device, which utilizes a limited-program in phase one of a program operation to reduce the programming time.

The secondary objective of the present invention is to provide a page buffer to perform the method for programming the multi-level-cell NAND flash memory device, which utilizes an exclusion circuit to perform an exclusion operation. Thus, the programming time is reduced.

In order to achieve the objectives, a method for programming the multi-level-cell NAND flash memory device and a pager buffer performing the same are disclosed. The method of the present invention, which programs a multi-level-cell NAND flash memory device having a plurality of memory cells, with each memory cell associated with a first register and a second register, comprises the steps of: (a) programming each memory cell to a zero state; (b) programming from the zero state to a first state by activating a first program signal and programming from the zero state to a quasi-second state and a semi-third state by activating a second program signal; (c) programming from the quasi-second state to a second state and programming from the semi-third state to a quasi-third state by activating the second program signal; and (d) programming from the quasi-third state to a third state by activating the first program signal. After Steps (a)-(d) are complete, each memory cells exhibits one of the zero, the first, the second and the third states.

The present invention also discloses a page buffer performing the method for programming the multi-level-cell NAND flash memory device having a plurality of memory cells, which comprises a bit line selection circuit, a first register, a second register, a first input circuit, a second input circuit, a first verify circuit, a second verify circuit and an exclusion circuit. The bit line selection circuit is used to determine a selected bit line and a shielding bit line. The first and the second registers latch a two-bit data to be programmed into the memory cells associated with the selected bit line. The two-bit data is received from the first input circuit and the second input circuit. The first verify circuit and the second verify circuit are used to verify the memory cells associated with the selected bit line. The exclusion circuit performs an exclusion operation to control the programming of each bit of the two-bit data.

BRIEF DESCRIPTION OF THE DRAWINGS

The invention will be described according to the appended drawings in which.

DETAILED DESCRIPTION OF THE INVENTION

Figure 7A:
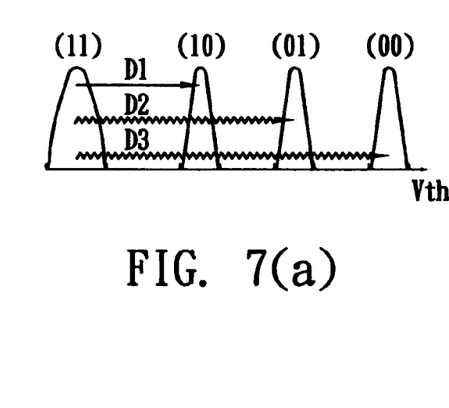
FIGS. 7(a)-7(c) illustrate the state transitions of the memory cells for each phase of the program operation of the method of the present invention.
Figure 7B:
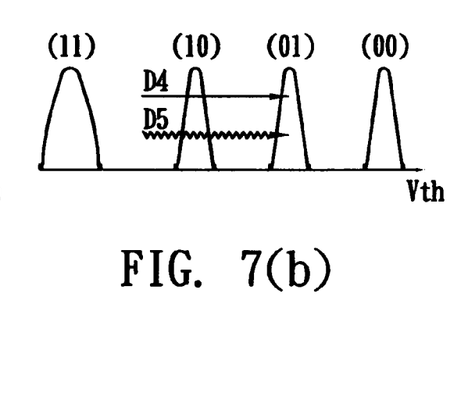
Figure 7C:
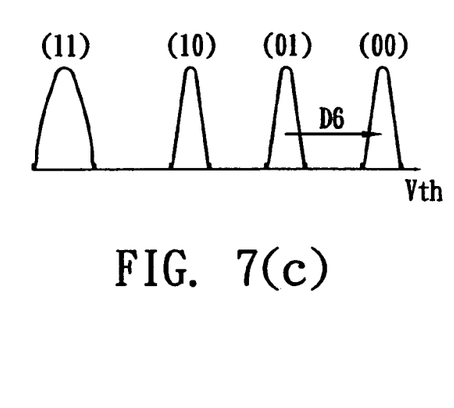
Figure 8:
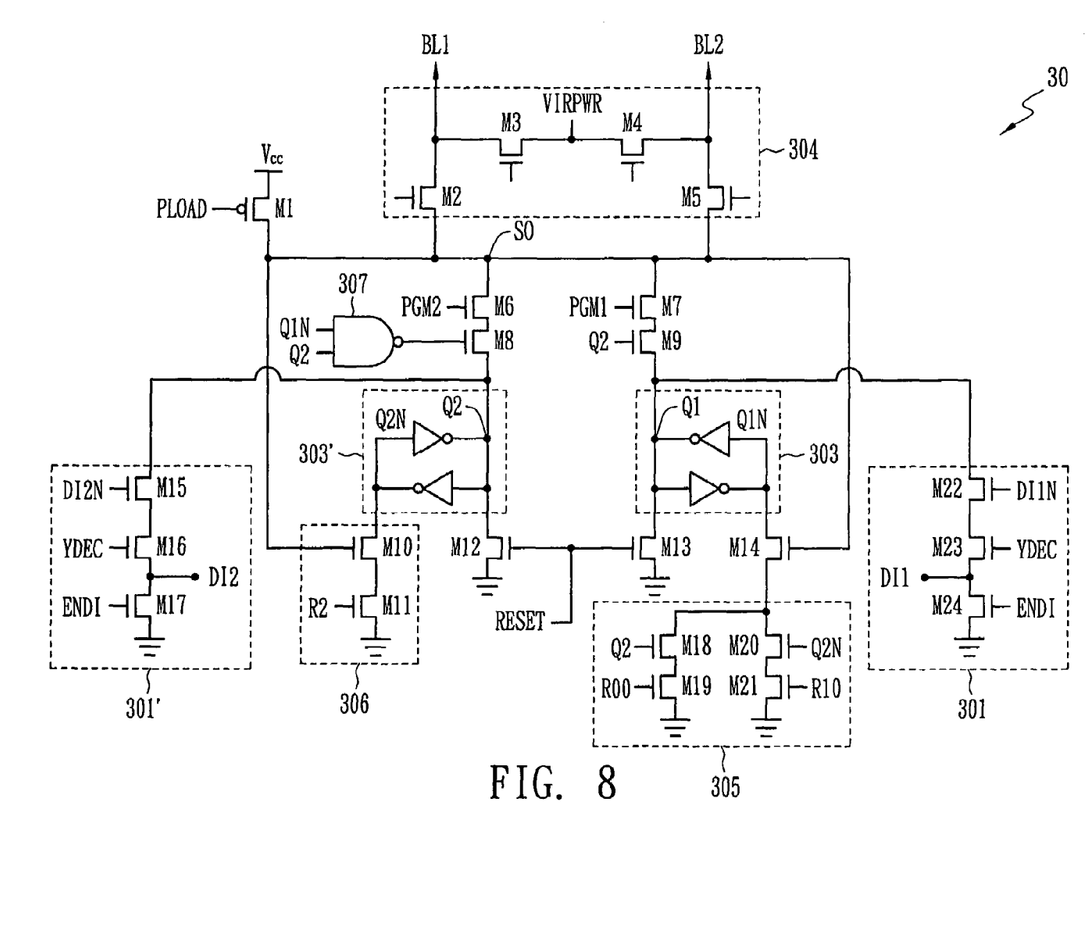
FIG. 8 shows one embodiment of the circuit of the page buffer of the present invention.
Figure 9:
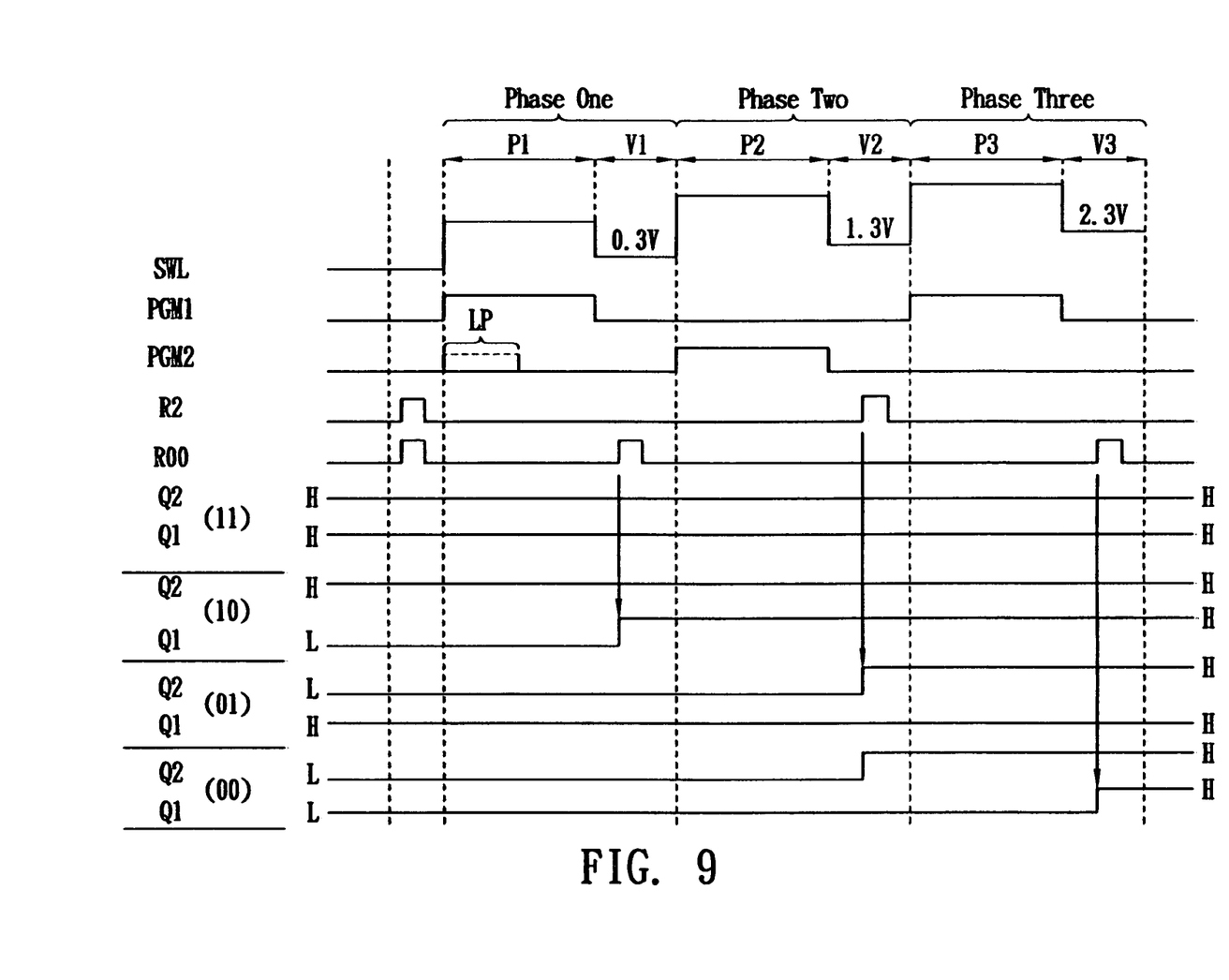
FIG. 9 shows the timing chart of related signals regarding FIG. 8.

FIGS. 7(a) through 7(c) show the state transition of the memory cell for each phase of the program operation in accordance with the present invention. FIG. 8 shows one embodiment of the circuit of the page buffer of the present invention. FIG. 9 shows the timing chart of related signals shown in FIG. 8.

The explanation of the state transition of FIGS. 7(a) through 7(c) is based on the circuit of FIG. 8; thus, FIG. 8 is described first as follows. The buffer page 30 of the present invention comprises a bit line selection circuit 304, a first register 303, a second register 303', a first verify circuit 305, a second verify circuit 306, a first input circuit 301, a second input circuit 301' and an exclusion circuit 307 (a NAND gate in the current embodiment). The bit line selection circuit 304 is coupled to two bit lines BL1 and BL2, which are two strings associated with plural memory cells 10 (refer to FIG. 2). Assuming that memory cells associated with the bit line BL1 are selected, another bit line BL2 acts as a shielding bit line by turning on transistor M4, turning off transistors M5 and M3, and grounding the signal VIRPWR. Before programming (i.e., before entering Phase One), the (Q2, Q1) state indicating the states of the second register 303' and the first register 303, respectively, is reset to (1,1) by activating the signal PLOAD to logic low, activating a second verify signal R2 sent to the second verify circuit 306 and a first verify signal R00 sent to the first verify circuit 305 to logic high. During data input, the signal ENDI of the first and the second input circuits 301 and 301' turns to logic high to turn on transistors M24 and M17. The signals DI1 and DI2 are two data inputs. If the data input DI1 is logic low, then the signal DI1N is logic high and node Q1 will be set to logic low through three serially connected transistors (M22, M23 and M24) with gate controlled by the signals DI1N, YDEC and ENDI. If the data input DI1 is logic high, then DI1N is logic low, and node Q1 will remain at the high state. Similarly, the same data input method is applied for node Q2.

The programming of the (10), (01) and (00) states are controlled by the first program signal PGM1 and the second program signal PGM2. In the current embodiment, the states of (11), (10), (01) and (00), are called the zero state, the first state, the second state and the third state, respectively. The memory cells to be programmed to the first state, the second state and the third state are called the first memory cells, the second memory cells and the third memory cells, respectively. Referring to FIG. 9, there are three phases in the program operation, which correspond to FIGS. 7(a), 7(b) and 7(c), respectively. P1-P3 and V1-V3 are indicative of the program periods and verify periods in each phase. In P1 period of Phase One, the memory cells to be programmed to the state of (10) are programmed by turning on the first program signal PGM1 under plural first programming shots, which are indicated by a solid pointer D1 of FIG. 7(a). In the meantime, the second program signal PGM2 is turned on under plural second programming shots indicated by LP period of Phase One in FIG. 9, where the number of the second programming shots is equal to or less than that of the first program shots. The LP period shown with dashed line on top means the length of the LP period is adjustable. The NAND gate 307 is used to gate the signal Q2 to avoid data conflict between the signals Q2 and Q1, which is an exclusion operation, since currently the signal Q2 is logic high and the signal Q1 is logic low. Thus, the NAND gate 307 can be used to control the programming of each bit of the two-bit data latched in the first and second registers 303 and 303'. The NAND gate 307 gates the signal Q2 to a node SO. Thus, the memory cells to be programmed to the states of (01) and (00) can be programmed for a while and to a quasi-second state and a semi-third state. Note that the quasi-second state means that some memory cells to be programmed to the state of (01) are programmed and completed in Phase One and the semi-third state means some memory cells to be programmed to the state of (00) are programmed and completed in Phase One. To verify the memory cells to be programmed to the state of (10), entering V1 period of Phase One, the voltage on the selected word line SWL decreases to 0.3V, which is lower than the threshold voltage distribution of the state of (10) (refer to FIG. 3). That is, if the desired threshold voltages (i.e., above 0.3V) of the programmed memory cells in Phase One ate achieved, the memory cells programmed to be the state of (10) cannot be turned on. Then, the selected bit line BL1 is pre-charged to a source voltage $V_{cc}$ by turning on transistors M2 and M1. Next, referring to the V1 period of FIG. 9, the first verify signal R00 is impulse-activated to turn on the transistor M19; the transistors M18 and M14 are turned on by the signal Q2 and the node SO, respectively. Therefore, the signal Q1 is turned high; that is, the state of (Q2, Q1) turns from (10) to (11) to confirm the program operation of the state of (10). Also, the memory cells with the state of (01) or (00), which turn off the transistor M18 due to the low state of Q2, keep the Q1 state unchanged. Referring back to FIG. 7(a), the zigzag pointers D2 and D3 mean some memory cells to be programmed to the states of (01) and (00), respectively, are programmed and completed, but some are not in Phase One.

For programming the memory cells to be programmed to the sate of (01), entering Phase Two of FIG. 9, the second program signal PGM2 activates to logic high. Then, the memory cells to be programmed to the state of (01) are programmed from the quasi-second state and completed, which is indicated by a solid pointer D4 of FIG. 7(b). To verify the program operation thereof, the voltage on the selected word line SWL decreases to 1.3V, which is lower than the threshold voltage distribution of the state of (01) (refer to FIG. 3). That is, if the desired threshold voltages (i.e., above 1.3V) of the programmed memory cells in Phase Two are achieved, the memory cells programmed to be the state of (01) cannot be turned on. Then, the selected bit line BL1 is pre-charged to a source voltage $V_{cc}$ by turning on transistors M2 and M1. Note that it is not necessary to activate the first program signal PGM1 because there is no state of (10) existing since the associated second register 303' (Q2) and first register 303 (Q1) are converted from (10) to (11) already in Phase One. When the second verify signal R2 is impulse-activated high to turn on the transistor M11 and the transistor M10 is turned on due to the high state of the node SO (i.e., with the source voltage $V_{cc}$). Thus, the signal Q2 changes from logic low to logic high. That is, the (Q2, Q1) state associated with the memory cells to be programmed to the states of (01) and (00) are converted to the states of (11) and (10), respectively. In Phase Two, some memory cells to be programmed to the state of (00) are programmed from the semi-third state to a quasi-third state, which is indicated by a zigzag pointer D5 (refer to FIG. 7(b)). In the current embodiment, the quasi-third state is the second state.

For programming the remaining memory cells to be programmed to the state of (01) (some are completely programmed in Phases Two and Three), entering Phase Three of FIG. 9, the first program signal PGM1 activates to logic high. Then, the memory cells to be programmed to the state of (00) are programmed from the quasi-third state (i.e., the second state in the current embodiment) and completed, which is indicated by a solid pointer D6 of FIG. 7(c). To verify the program operation thereof, the voltage on the selected word line SWL decreases to 2.3V, which is lower than the threshold voltage distribution of the state of (00) (refer to FIG. 3). That is, if the desired threshold voltages (i.e., above 2.3V) of the programmed memory cells in Phase Three are achieved, the memory cells programmed to be the state of (00) cannot be turned on. Then, the selected bit line BL1 is pre-charged to a source voltage $V_{cc}$ by turning on transistors M2 and M1, and the node SO is charged to the source voltage. When the first verify signal R00 is impulse-activated high to turn on the transistor M19, the transistor M18 is turned on due to the high state of the Q2 (converted to logic high in Phase Two) and the transistor M14 is turned on due to the high state of the node SO. Thus, the signal Q1 changes from logic low to logic high.

The method for programming a NAND flash memory device of the present invention, which utilizes a limited-program (i.e., programming some memory cells to be programmed to the state of (10) and (00)) in Phase One of the program operation, indeed achieves the primary objective of the present invention, which reduces the programming time. In addition, the page buffer utilizing an exclusion circuit to perform the method of the present invention to reduce the programming time is disclosed above and thus, the secondary objective is achieved.

The above-described embodiments of the present invention are intended to be illustrative only. Numerous alternative embodiments may be devised by those skilled in the art without departing from the scope of the following claims.

What is claimed is:

1. A method for programming a NAND flash memory device having zero memory cells, first memory cells, second memory cells and third memory cells, each memory cell being associated with a first register and a second register, the method comprising the steps of:

(a) programming the zero, the first, second and the third memory cells to a zero state;

(b) programming the first memory cells from the zero state to a first state by activating a first program signal, and programming the second memory cells from the zero state to a quasi-second state and the third memory cells from the zero state to a semi-third state by activating a second program signal;

(c) programming the second memory cells from the quasi-second state to a second state and programming the third memory cells from the semi-third state to a quasi-third state by activating the second program signal; and (d) programming the third memory cells from the quasi-third state to a third state by activating the first program signal.

2. The method for programming a NAND flash memory device of claim 1, wherein, at Step (b), the first program signal is activated under a plurality of first program shots and the second program signal is activated under a plurality of second program shots.

3. The method for programming a NAND flash memory device of claim 2, wherein the number of the second program shots is equal to or less than that of the first program shots.

4. The method for programming a NAND flash memory device of claim 1, wherein Step (b) is performed with an exclusion operation to avoid data conflict between the first and the second registers.

5. The method for programming a NAND flash memory device of claim 1, further comprising a step of verifying the first memory cells by a first verify signal between Step (b) and Step (c).

6. The method for programming a NAND flash memory device of claim 4, further comprising a step of verifying the second memory cells by a second verify signal between Step (c) and Step (d).

7. The method for programming a NAND flash memory device of claim 5, further comprising a step of verifying the third memory cells by the first verify signal after Step (d).

8. The method for programming a NAND flash memory device of claim 5, wherein the state of the first register corresponding to each first memory cell is programmed to logic high.

9. The method for programming a NAND flash memory device of claim 4, wherein the exclusion operation is implemented by a NAND gate.

* * * * *